(12) United States Patent
Yamauchi

(10) Patent No.: US 6,574,789 B1
(45) Date of Patent: Jun. 3, 2003

(54) EXPOSING METHOD AND APPARATUS FOR SEMICONDUCTOR INTEGRATED CIRCUITS

(75) Inventor: Satoshi Yamauchi, Kuwana (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/528,719

(22) Filed: Mar. 20, 2000

(30) Foreign Application Priority Data

Oct. 25, 1999 (JP) ............................................ 11-303123

(51) Int. Cl.[7] .............................................. G06F 17/50
(52) U.S. Cl. .......................................... 716/21; 716/19
(58) Field of Search ................................... 716/21, 19

(56) References Cited

U.S. PATENT DOCUMENTS

| | | | | |
|---|---|---|---|---|
| 5,914,889 A | * | 6/1999 | Cohen et al. .................. | 716/8 |
| 5,984,505 A | * | 11/1999 | Miyajima .................... | 700/121 |
| 6,035,111 A | * | 3/2000 | Suzuki et al. ................. | 716/11 |
| 6,081,272 A | * | 6/2000 | Morimoto et al. .......... | 345/420 |
| 6,178,543 B1 | * | 1/2001 | Chen et al. .................... | 716/19 |
| 6,189,135 B1 | * | 2/2001 | Chisaka ....................... | 716/19 |
| 6,330,708 B1 | * | 12/2001 | Parker et al. ................ | 716/19 |

* cited by examiner

Primary Examiner—Matthew Smith
Assistant Examiner—A. M. Thompson
(74) Attorney, Agent, or Firm—Staas & Halsey LLP

(57) ABSTRACT

An exposing method for semiconductor integrated circuits by extracting exposing pattern data for predetermined units of area from the exposing pattern data input to an exposing apparatus, merging the extracted exposing pattern data with the dummy pattern data for every predetermined unit of area and exposing the merged exposing pattern data and dummy pattern data for every unit of area.

8 Claims, 14 Drawing Sheets

EXPOSING METHOD AND APPARATUS FOR SEMICONDUCTOR INTEGRATED CIRCUITS

BACKGROUND OF THE INVENTION

1. Field of the Invention

The present invention generally relates to an exposing method and apparatus for semiconductor integrated circuits, or large scale integration ("LSI"), and particularly to a method of generating exposing patterns and, in detail, a method of rating exposing patterns and an exposing apparatus including a dummy pattern generating process and a dummy pattern adding process.

2. Description of the Related Art

Recently, high-density and high-integration structures of semiconductor integrated circuits have been realized by utilizing a multilayer wiring technique in which two or more wiring layers are laid. In such multilayer wiring structures, a structure including a large stepped area can be easily generated and, thus, a flat semiconductor wafer is hard to attain. Therefore, wiring may be easily areas will cause pattern resolution failure because the light beam is never set within the focal depth during the exposing process. Therefore, a method is proposed, in view of alleviating the stepped area, where the pattern density is uniform and the semiconductor wafer is flat by using dummy patterns, which are electrically independent and do not function as an actual circuit. The dummy patterns are generated in an area where the pattern density is rather low and, then, the dummy patterns and other the other patterns are combined.

FIG. 8 illustrates a prior art method for generating dummy patterns and then merging them to the design patterns. In FIG. 8, numeral 30 designates a design pattern; 31, dummy pattern data; 32, an exposing pattern; 33, a reticle inspection pattern; and 34, a reticle, mask or wafer after exposing or inspection. Moreover, the figure in the shape of the letter "F" in FIG. 8 schematically indicates patterns forming a circuit and small rectangular shapes of the same pattern are dummy patterns.

In the flow of the process shown in FIG. 8, the design pattern 30, generated by the design process, and dummy pattern data 31, generated based on the design pattern 30, are merged (ORed) to form one synthesized pattern and the exposing pattern 32 is generated from this synthesized pattern through various data processes. Based on the exposing pattern 32, the process of exposing the reticle, mask or wafer is executed to finally manufacture the reticle, mask or wafer 34. On the other hand, the reticle inspection pattern 33 is generated from the same exposing pattern data 32 and inspection of reticle 34 is executed based on the reticle inspection pattern 33.

Next, the process for generating the dummy pattern 31 based on the design pattern 30 illustrated in FIG. 8 and the process for merging the generated dummy pattern 31 and design pattern 30 will be explained in detail with reference to FIGS. 9(a)–9(g). Here, the design patterns are illustrated on the left-hand side of this figure, while the dummy patterns for the generation process are illustrated in the right-hand side.

First, FIG. 9(a) shows the initial status. The design patterns illustrated here are the wiring patterns 40 having two vertical lines. Meanwhile, the dummy patterns are not yet generated.

Next, in FIG. 9(b), the dummy patterns 41, made of small rectangles of the same shape, are generated regularly throughout the entire area. In this case, for example, when a "dummy rule" is $1.0\mu$, dummy patterns of $1.0\mu$ squared are generated in every $1.0\mu$ interval, namely, one dummy pattern is generated in every 4 $\mu$m squared. If the actual size of a device element is 15.5 mm×15.5 mm, the dummy pattern generation area will be as wide as 5 times the actual size of the device element, namely 77.5 mm×77.5 mm. Therefore, the number of dummy patterns to be generated in this area is about $1.5 \times 10^9$ ((77500×77500)/4). When the amount of data required for one dummy pattern is assumed to be 5 bytes, an amount of data as high as $7.5 \times 10^9$ bytes is required for all dummy patterns. Moreover, when the "dummy rule" is $2.0\mu$, dummy patterns of $2.0\mu$ squared are generated at an interval of every $2.0\mu$, namely, the number of dummy patterns to be generated in this area is about $3.8 \times 10^8$ [77500×77500]/16] and the number of bytes required for all dummy patterns reaches $1.9 \times 10^9$ bytes.

In FIG. 9(c), information about the design patterns 40 is read and then artificially overlapped onto the dummy pattern 41 (hereinafter referred to as artificially overlapped design patterns 42). In FIG. 9(d), the artificially overlapped design patterns 42 are shifted outwardly as much as the mutual interval between the dummy patterns 41 and design patterns 40, which causes the pattern shape to widen. In FIG. 14(e), some data comprising the dummy patterns 41 and shifted artificially overlapped design patterns 44 are merged to remove the parts exposed multiple times. With the process explained above, the unwanted area in which the dummy patterns 41 and the artificially overlapped design patterns 44 are overlapped can be removed. In FIG. 14(f), the artificially overlapped design patterns 44 are removed from the data and the remaining data is defined as the dummy patterns 45, which depend on the design patterns on the left-hand side of the figure. Finally, in FIG. 14(g), the dummy patterns 45 generated in the preceding step and the original design patterns 40 are merged.

However, the conventional method for dummy pattern generation explained above has a problem in that a large amount of dummy patterns are added in addition to a large amount of design patterns and, thereby, the total amount of data is greatly increased. If the design patterns in the initial stage when generating the exposing patterns already contains a large amount of data, the processing time is increased to a large extent for the subsequent processes, namely, in the process to convert the design patterns to the exposing patterns or to the patterns for the inspection apparatus. Moreover, as the computer load increases, the occurrence of problems such as defective computer operations also increases.

Therefore, it is an object of the present invention to overcome the problems explained above. A further object of this invention is to provide a method of executing the exposing process and inspection process by adding the dummy patterns to the design patterns without the need to process large amounts of data for a series of exposing pattern generation processes.

SUMMARY OF THE INVENTION

It is an object of the present invention to overcome the above-described problems of the prior art by exposing semiconductor integrated circuits by inputting exposing pattern data to an exposing apparatus and extracting exposing pattern data for every predetermined unit area from the exposing pattern data and merging the extracted exposing pattern data and dummy pattern data for every unit area identical to the predetermined unit area and exposing the merged exposing pattern data and dummy pattern data for every predetermined unit area.

It is another object of the present invention to overcome the above-described problems in the prior art by an apparatus for exposing patterns of a semiconductor integrated circuit device in a semiconductor integrated circuit manufacturing apparatus, having a first memory for storing exposing pattern data extracted for every predetermined unit area and a second memory for storing dummy pattern data for every predetermined unit area and dummy pattern generation calculating unit for synthesizing the dummy pattern data input from the second memory to the exposing pattern input from the first memory.

According to this manufacturing apparatus, since the dummy patterns are generated in the exposing apparatus for every unit area of the exposing process, an amount of data of the exposing pattern to be processed by the exposing apparatus can be reduced and, thereby, a high speed exposing pattern data generating process can be realized and the load of the computer can also be reduced.

DETAILED DESCRIPTION OF THE PREFERRED EMBODIMENTS

Figures 1A, 1B:
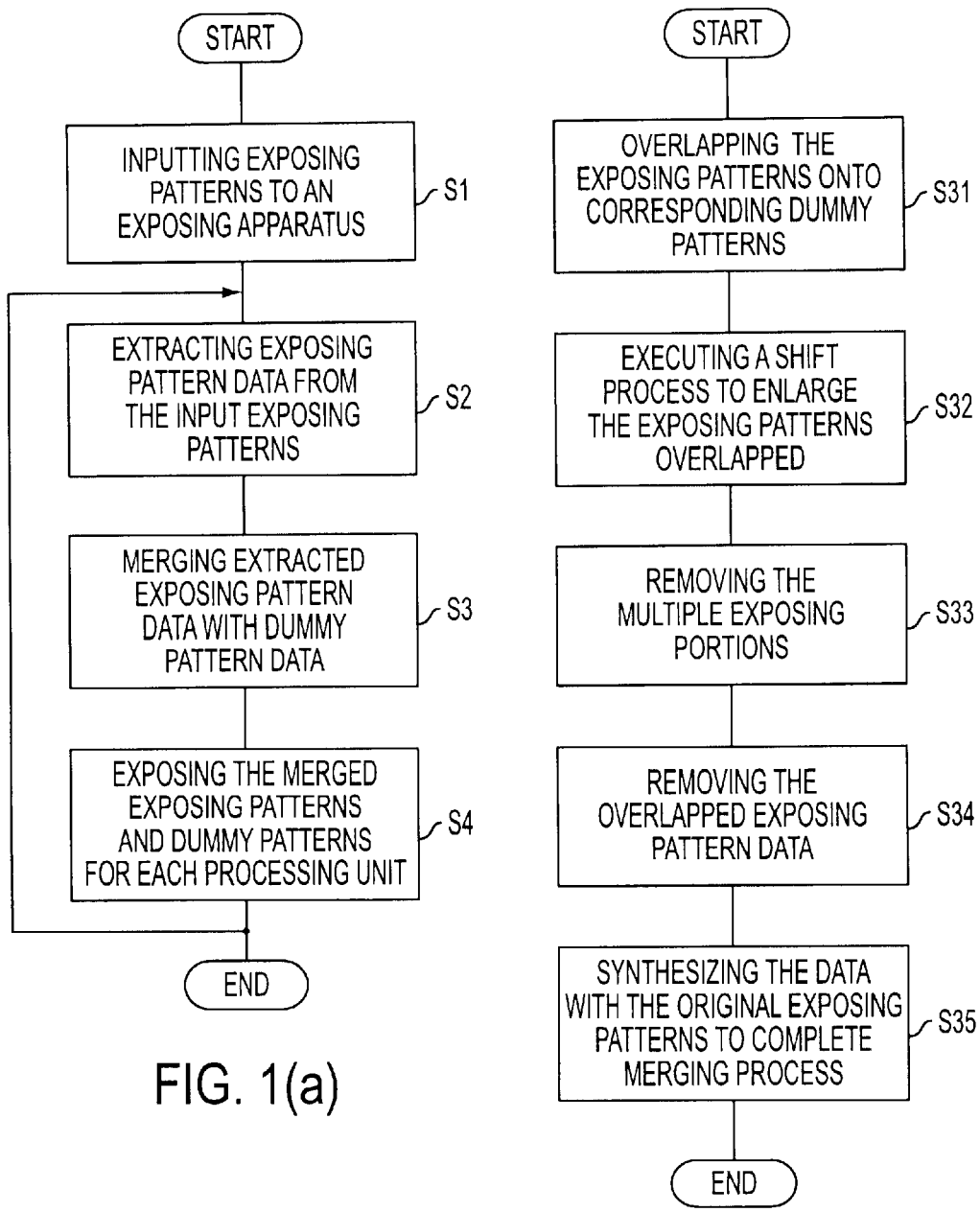
FIGS. 1(a) and 1(b) illustrate the principle of the present invention.

The preferred embodiments of the present invention will be explained below. In this description, the same reference numerals are used for the same elements throughout the drawings and duplicate descriptions will be avoided.

FIGS. 1(a) and 1(b) illustrated the principle of the present invention. First, the principle of the present invention will be explained with reference to FIG. 1(a). In step S1, exposing patterns generated from the design pattern through various processes are input to an exposing apparatus. Next, in step S2, the exposing pattern data for each predetermined processing unit is extracted from the input exposing patterns. Next, in step S3, the extracted exposing pattern data for each processing unit is merged with the dummy patterns for each corresponding unit area. In step S4, the merged exposing patterns and dummy patterns are exposed for each processing unit. Steps S1 through S4 are repeated for all processing units.

FIG. 1(b) is a flowchart for explaining step S3, as shown in FIG. 1(a), in detail. First, in step S31, the exposing patterns for each predetermined processing unit are overlapped onto the corresponding dummy patterns for each predetermined processing unit. Next, in step S32, a shift process is executed to enlarge the exposing patterns which are artificially overlapped in step S31, as much as the predetermined size. Next, in step S33, the multiple exposing portions from the data generated in step S32 are removed. Next, in step S34, the artificially overlapped exposing pattern data is removed from the data generated in step S33. Finally, in step S35, the data is synthesized with the original exposing patterns for each predetermined processing unit to complete the merging process of the exposing patterns and the corresponding dummy patterns for each predetermined processing unit.

According to the method explained above, since it is no longer necessary to generate dummy patterns for all ranges of exposing pattern data at one time, the total amount of data can be reduced and high speed processing can be realized, reducing the overall load on computers.

Figure 2:
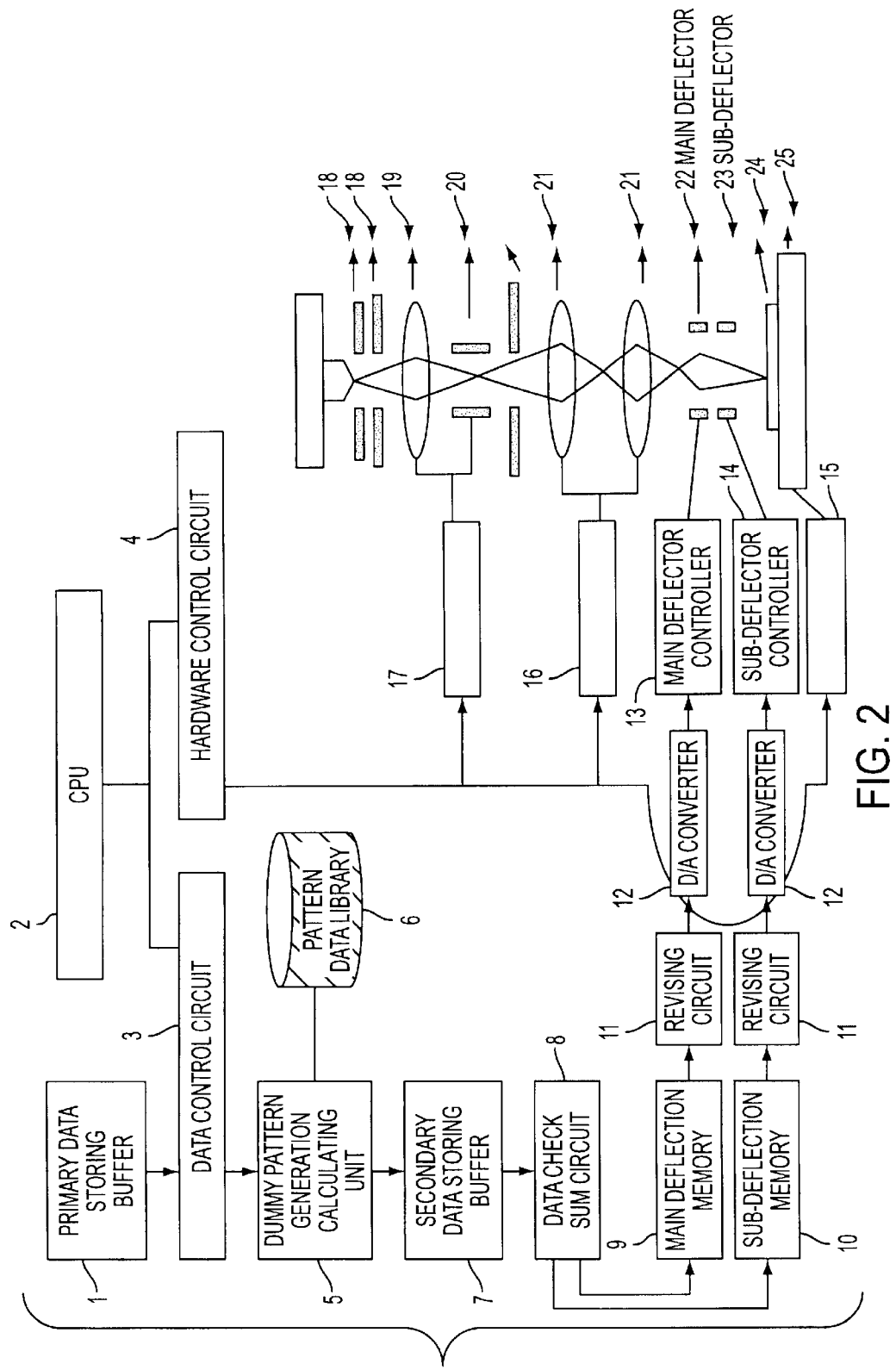
FIG. 2 illustrates an essential portion of an electron beam exposing apparatus of an embodiment of the present invention.

FIG. 2 is a diagram illustrating the essential portion of an electron beam exposing apparatus according to the first embodiment of the present invention. FIG. 2 shows a primary data storing buffer 1 for storing exposing pattern data received from an external circuit, a CPU 2, a data control circuit 3 and a hardware control circuit 4. The data stored in the primary data storing buffer 1 is transferred to a dummy pattern generation calculating unit 5 under the control of data control circuit 3. The dummy pattern generation calculating unit 5 generates dummy patterns for each predetermined unit area (for example, "stripe" for a raster type exposing apparatus or "sub-field" for a vector type apparatus) and stores the corresponding data in the secondary data storing buffer 7 after generating the dummy patterns. The dummy pattern generation calculating unit 5 is designed to enable access to a pattern data library 6. This pattern data library 6 stores data corresponding to various dummy patterns, which differ respectively with respect to predetermined conditions such as interval, shape, unit area or the like. A data check sum circuit 8 checks the data read from the secondary data storing buffer 7.

A main deflection memory 9 stores main deflection data for greatly deflecting an electron beam using a main deflector 22. A revising circuit 11 revises and calculates data read from the main deflection memory 9. A D/A converter 12 converts the data revised by the revising circuit 11 to an analog signal. A main deflector controller 13 controls a main deflector 22. Moreover, a sub-deflection memory 10 stores sub-deflection data to slightly deflect the electron beam using a sub-deflector 23. A revising circuit 11 revises and calculates a data read operation from the sub-deflection memory 10. The D/A converter 12 converts the data revised by the revising circuit 11 to an analog signal. A sub-deflector controller 14 controls the sub-deflector 23.

Here, one difference between the electron beam exposing apparatus of this embodiment and the electron beam exposing apparatus of the prior art is that the dummy pattern generation calculating unit 5 is provided between the data control circuit 3 and secondary data storing buffer 7 and this dummy pattern generation calculating unit 5 accesses the pattern data library 6.

Figure 3:
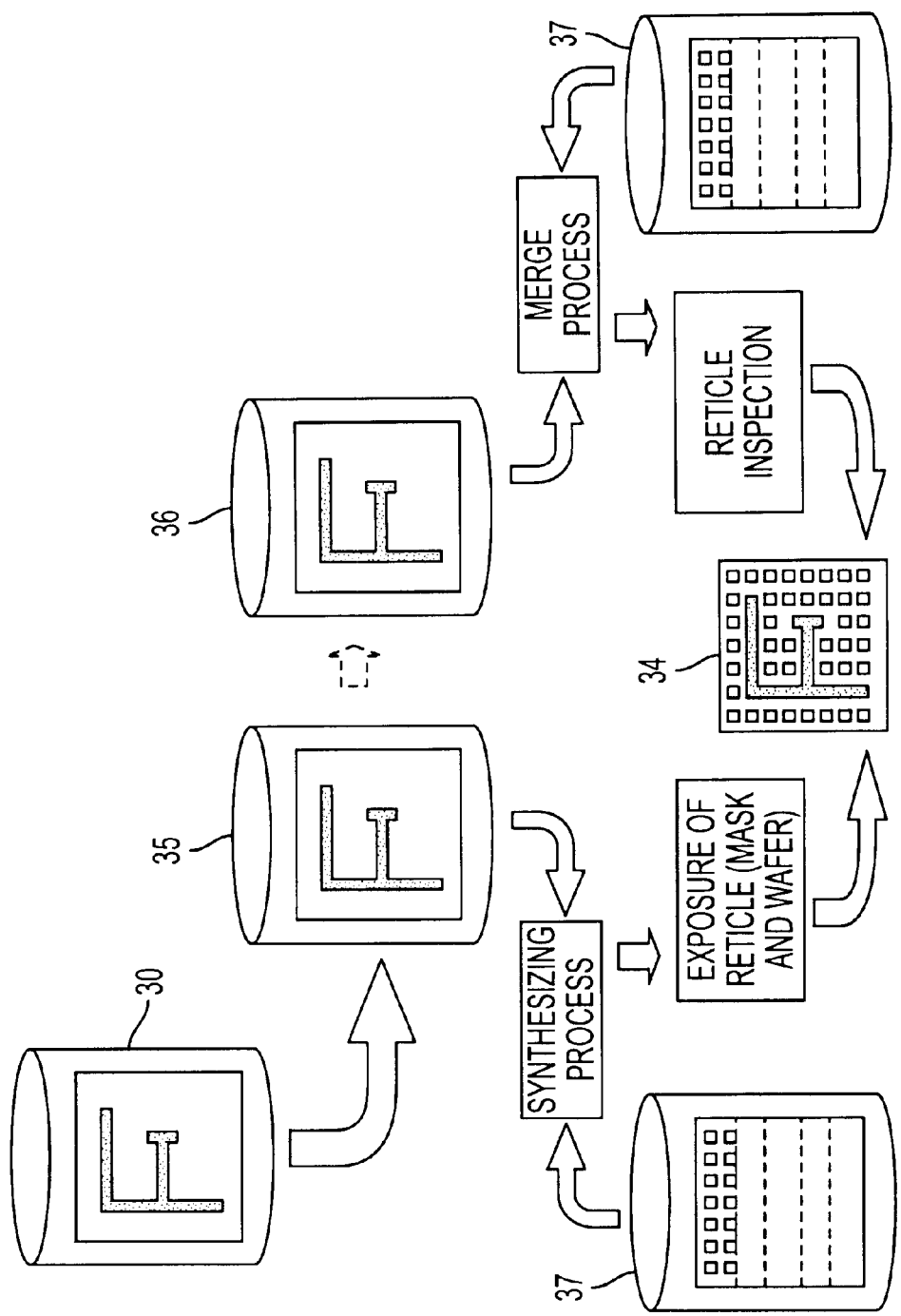
FIG. 3 illustrates a summary of a second embodiment of the present invention.

Next, the summary of the second embodiment of the present invention will be explained with reference to FIG. 3. In the second embodiment, after the exposing pattern 35 is generated from the design pattern 30, it is synthesized with the dummy pattern 37. Moreover, after the exposing pattern 35 is converted to generate the reticle inspection data 36, the reticle inspection data is merged with the dummy pattern 37. Through the respective processes such as reticle (mask or wafer) exposing and reticle inspection, etc., the final reticle (mask or wafer) 34 can be manufactured. Here, the dummy pattern 37 is made up of the stored regular pattern without relation to the shape of the design pattern 30 and has a range extending over the entire size of the reticle (mask or wafer) and occupies only a small area. Therefore, the dummy pattern contains only a small amount of data. The exposing method of this embodiment may be applied to any exposure object among the reticle, mask and wafer.

Figure 4A:
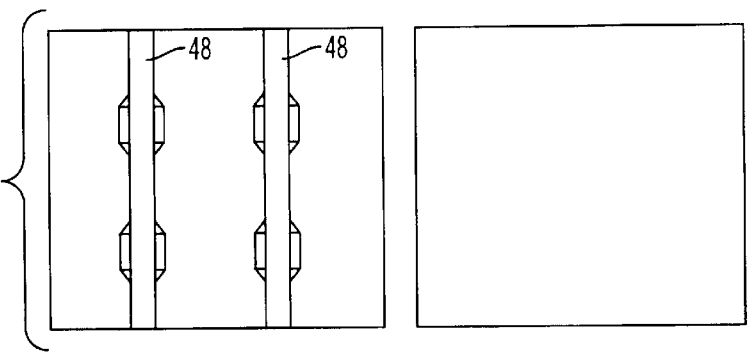
FIGS. 4(a) through 4(g) illustrate dummy pattern generation and merging according to the second embodiment of the present invention.
Figure 4B:
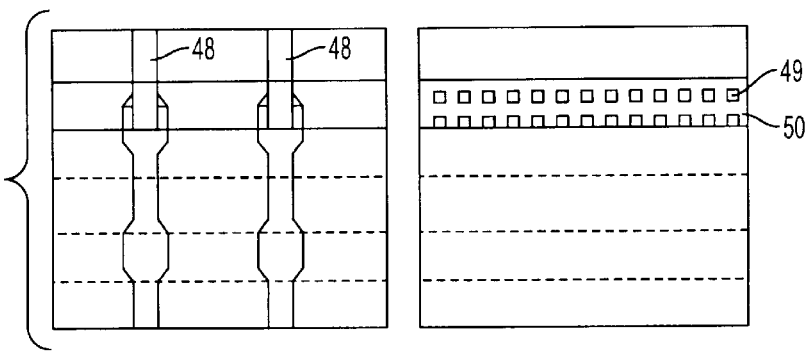
Figure 4C:
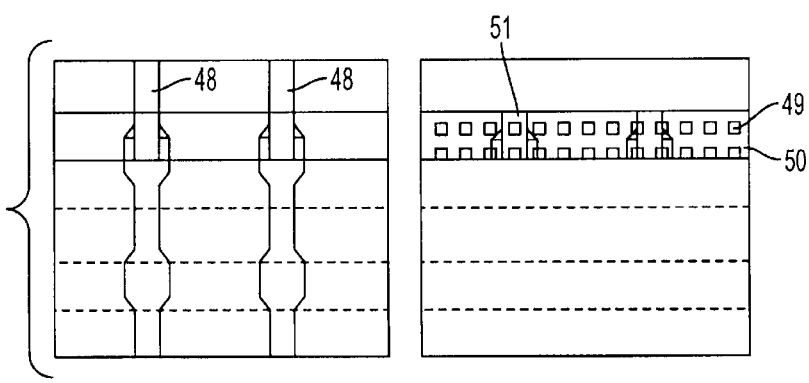
Figure 4D:
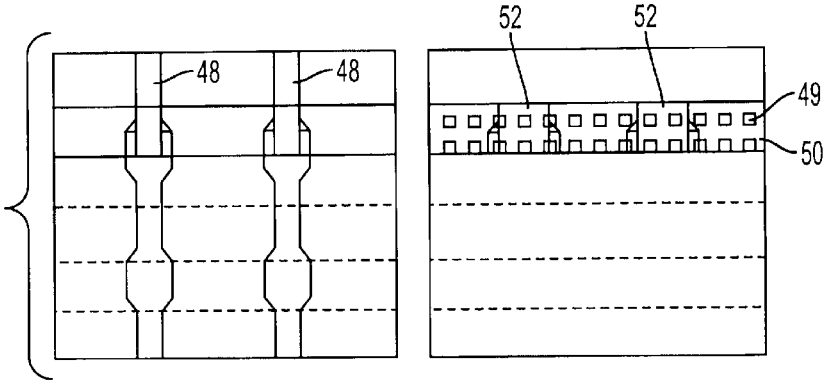
Figure 4E:
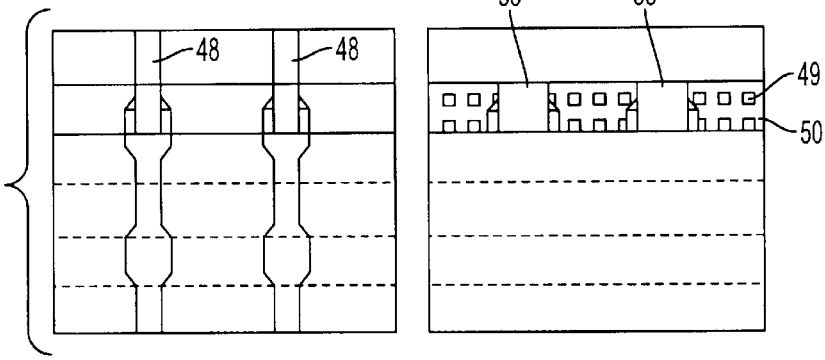
Figure 4F:
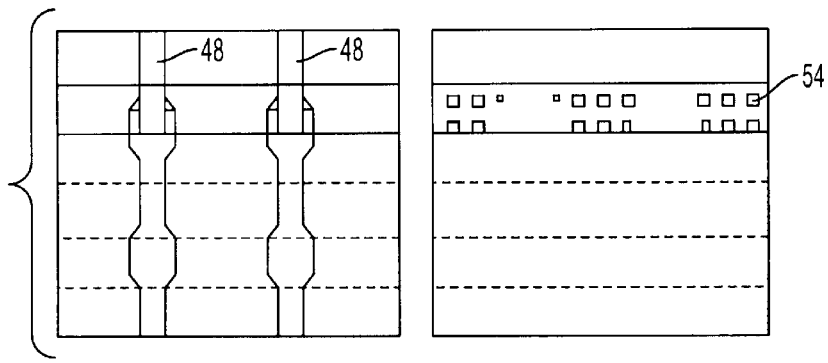

Using FIGS. 4(a) to 4(g), dummy pattern generation and merging according to the second embodiment of the present invention will be explained in detail. Here, the exposing patterns are illustrated on the left-hand side of FIGS. 4(a)–4(g) and the dummy patterns are illustrated on the right-hand side. First, FIG. 4(a) illustrates an initial status. The exposing patterns are composed of two vertical wiring patterns 48 and are divided into basic shapes such as rectangles or triangles as the exposing unit. The dummy patterns are not yet formed. Next, in FIG. 4(b), dummy patterns 49, all having a small rectangular shape, are read from the pattern data library 6 and are generated only in one stripe area 50, which is a stage moving unit for a raster type exposing apparatus. In this example, the first stage stripe from the upper side is already processed. The second stage stripe from the upper side is the next object of the process and will be explained herein. In FIG. 4(c), information about the exposing patterns 48 corresponding to the area of stripe 50 is read and then overlapped artificially onto the dummy patterns 49 (hereinafter referred to as artificially overlapped exposing patterns 51). In FIG. 4(d), the artificially overlapped exposing patterns 51 are shifted toward their external sides (the patterns will widen) as far as a mutual interval between the dummy patterns 49 and exposing patterns 48. In FIG. 4(e), some of the data is merged to remove the duplicated portions of the dummy patterns 49 and artificially overlapped exposing patterns 53 after the shift. In FIG. 4(f), the artificially overlapped exposing patterns 53 are removed and the dummy patterns 54 are generated depending on the original exposing patterns 48 on the left-hand side of the figure.

Figure 4G:
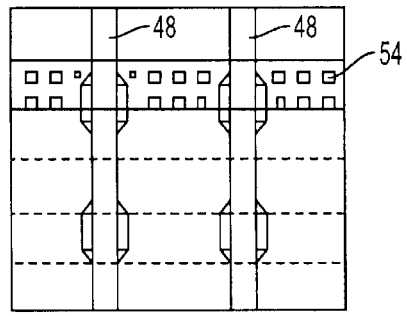

Finally, in FIG. 4(g), the dummy patterns 54 generated in the preceding step are synthesized with the exposing patterns 48, thereby generating dummy patterns 54 and exposing patterns 48 corresponding to the area of stripe 50.

As explained above, since the number dummy patterns generated immediately before the exposing process is the same as the number of stage movements, i.e., one stripe in our example, it is not necessary to remarkably increase the amount of data needed for the exposing patterns. Moreover, since the dummy patterns are generated within a narrow range, the time required to generate new dummy patterns is short enough to avoid increasing the exposure throughput, time. In addition, it is also possible to conduct, in parallel during the exposing process, the dummy pattern generation processes for the next exposing process unit.

Figure 5A:
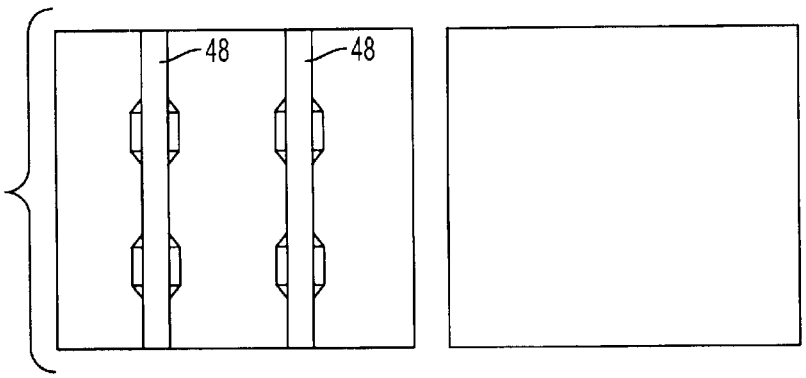
FIGS. 5(a) through 5(g) illustrate dummy pattern generation and merging according to a third embodiment of the present invention.
Figure 5B:
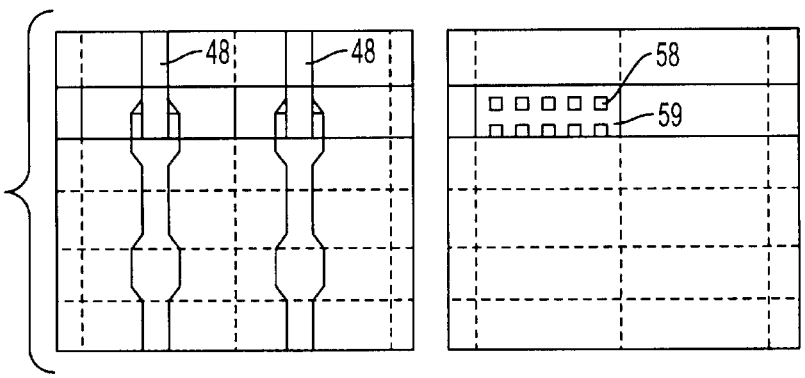
Figure 5C:
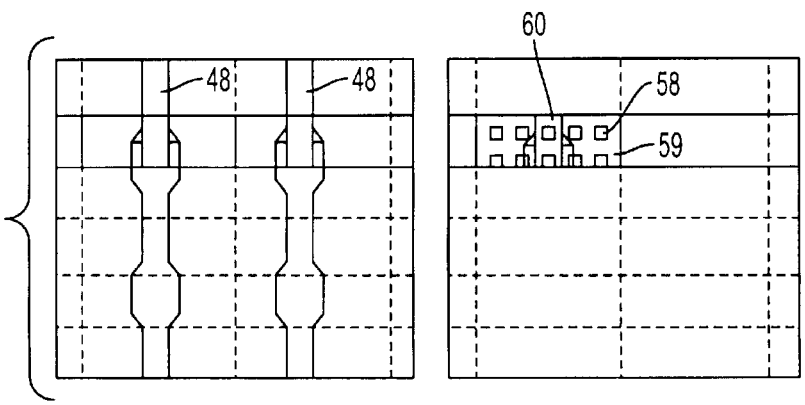
Figure 5D:
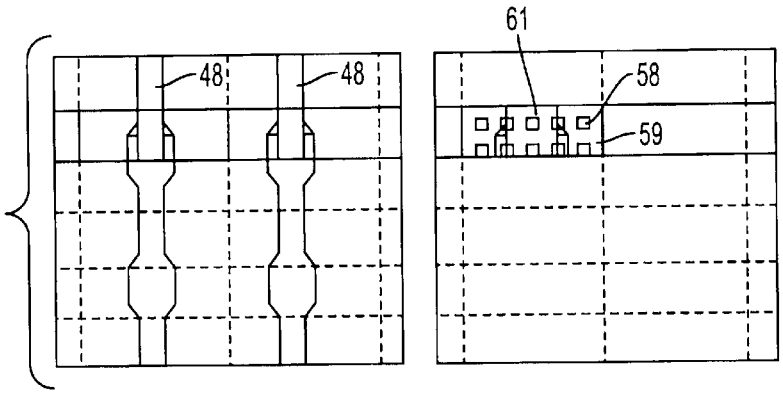
Figure 5E:
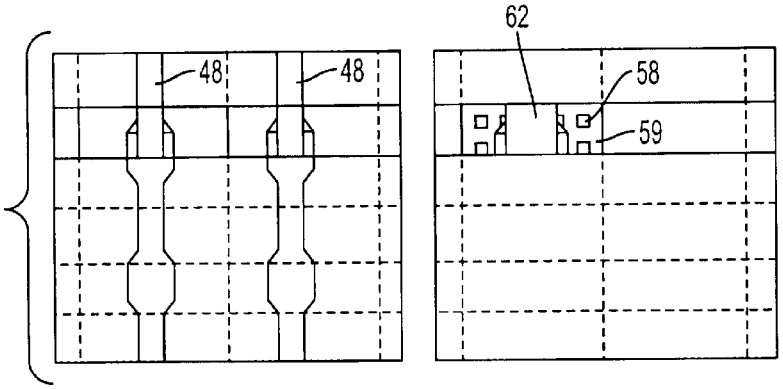
Figure 5F:
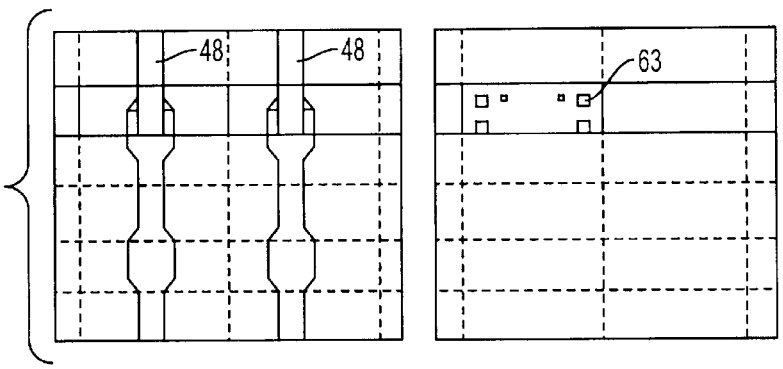
Figure 5G:
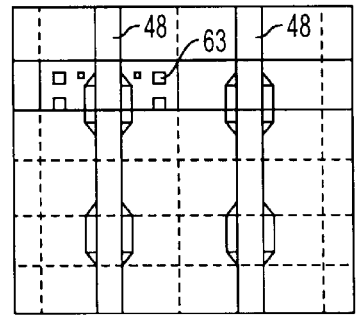

The third embodiment of the-present invention will now be described. Each step of the dummy pattern generation processes of the third embodiment is illustrated in FIGS. 5(a) to 5(g). In this embodiment, a vector type exposing apparatus is shown, unlike the second embodiment which showed a raster type exposing apparatus. Therefore, as illustrated in FIG. 5(b), processing unit areas to generate dummy patterns are formed in the unit field. In this embodiment, the second upper field on the left-hand side of the figure is considered to be the processing object. Here, a field is the unit for shifting the exposing beam through a large deflection in the vector-type exposing apparatus. The field is the area representing a unit of: stage movement. In addition, it is also possible to generate the dummy patterns using, for example, a sub-field as the unit area in place of the field. The sub-field is the unit area for shifting the exposing beam through a small deflection in the vector type exposing apparatus. The area for a unit of stage movement and beam deflection, depending on the characteristics of the exposing apparatus, is adequate as the unit area to generate dummy patterns. A more detailed explanation will be omitted as the third embodiment is almost identical to the second embodiment except for the unit area to generate dummy patterns.

Next, with reference to FIG. 6 and FIGS. 7(a) to 7(i), the fourth embodiment of the present invention will be explained. In the fourth embodiment, the dummy patterns are generated only in designated areas to compensate for the shape of the exposing patterns. Moreover, the dummy pattern generation calculating unit 5 generates patterns in a shape designated from the external side as the dummy patterns.

Figure 6:
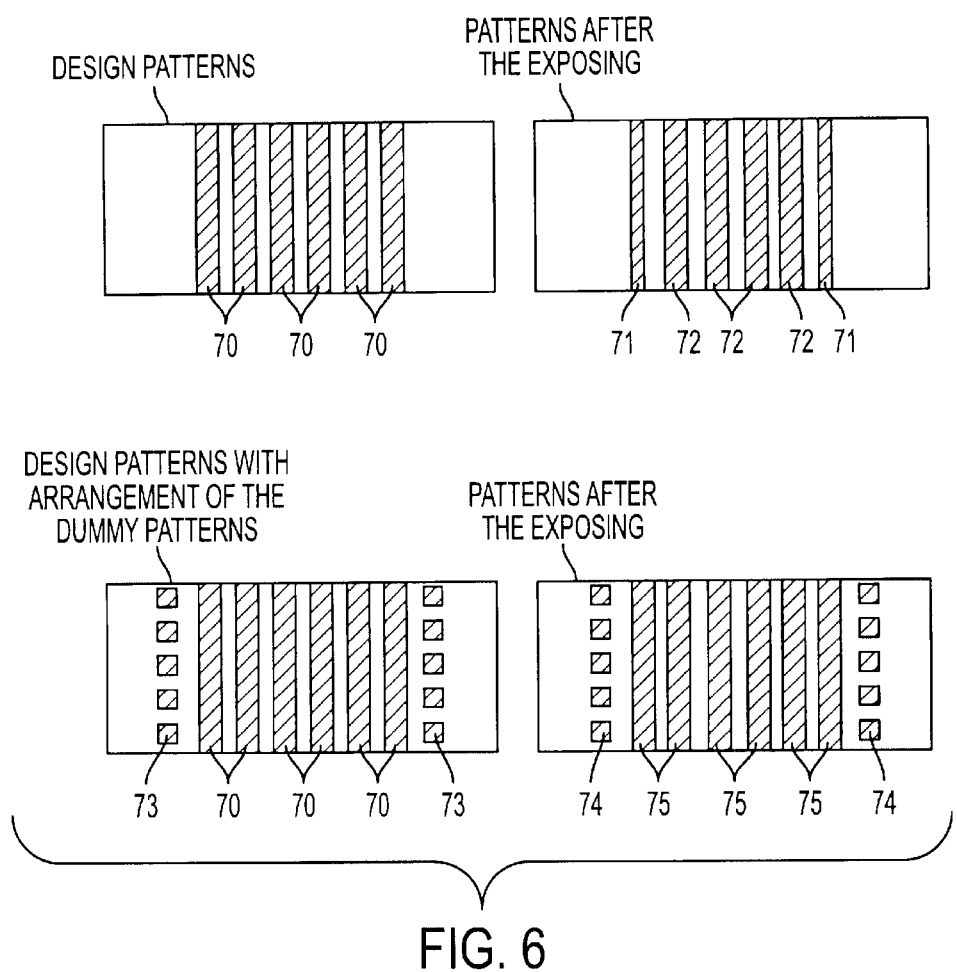
FIG. 6 shows the dummy patterns used to prevent narrowing of the wiring width.

FIG. 6 explains arranging dummy patterns to prevent the wiring width from becoming too thin. As illustrated in FIG. 6, when a plurality of approximated wiring patterns 70 having equal line widths are arranged in equal intervals and there is no exposing pattern at the area near the external side thereof, a phenomenon where the external side wiring patterns 71 become thinner than the line width of the internal side wiring patterns 72 can be observed. To prevent such a phenomenon from occurring, dummy patterns 73, which are not related to the circuit, are arranged at the external sides of the wiring patterns 70.

Figure 7A:
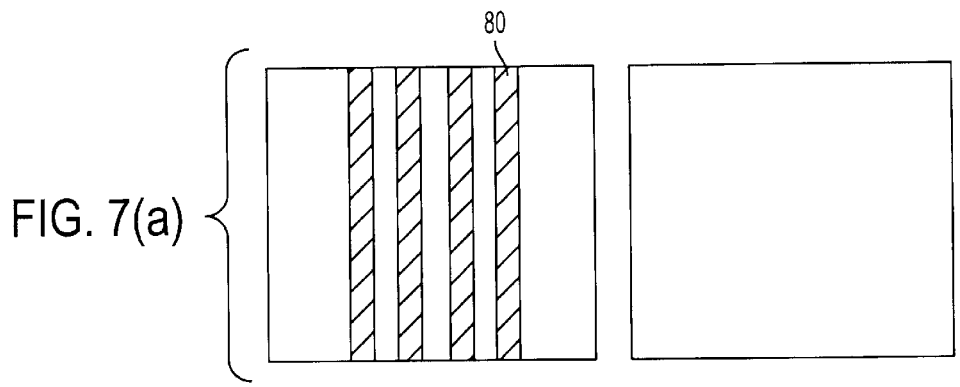
FIGS. 7(a) through 7(i) illustrate dummy pattern generation and merging according to a fourth embodiment of the present invention.
Figure 7B:
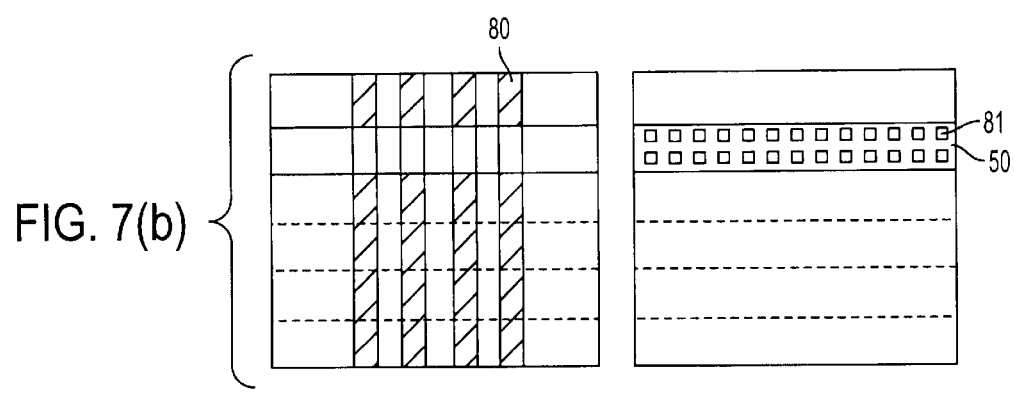
Figure 7C:
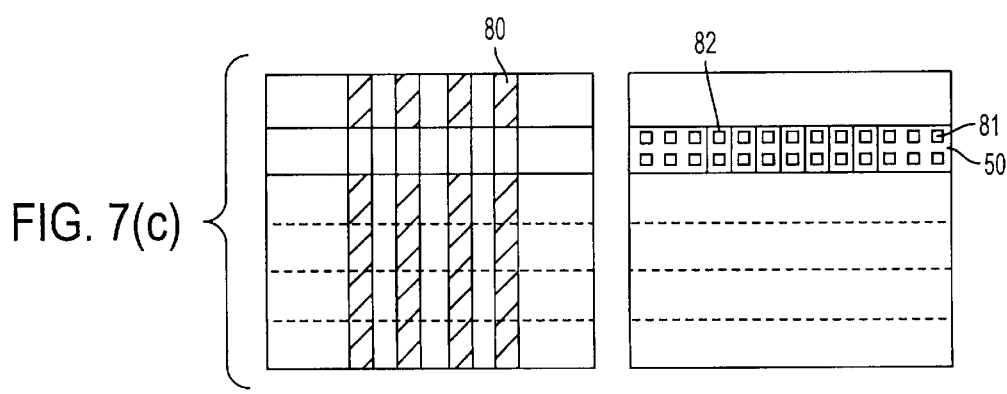
Figure 7D:
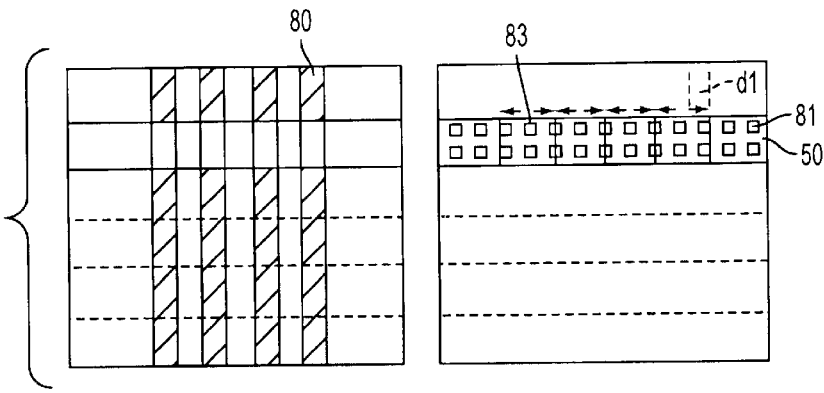
Figure 7E:
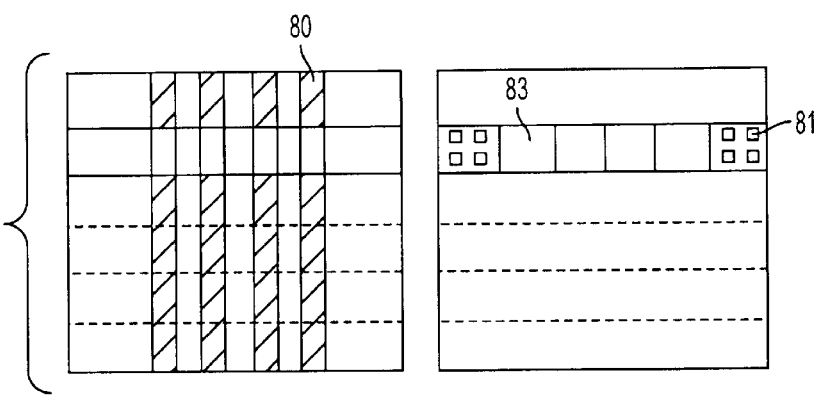
Figure 7F:
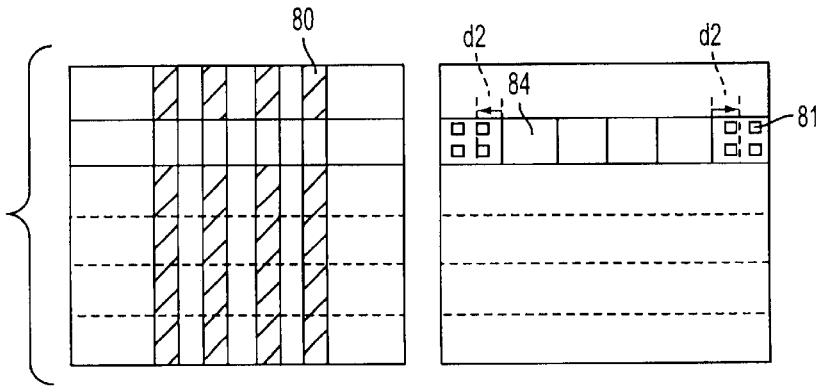
Figure 7G:
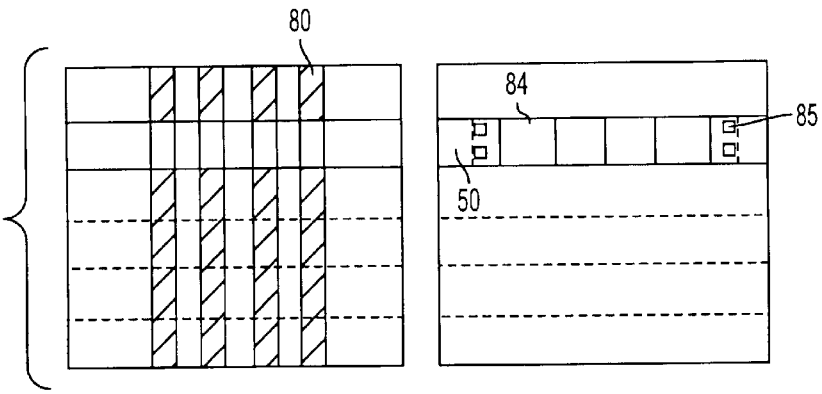
Figure 7H:
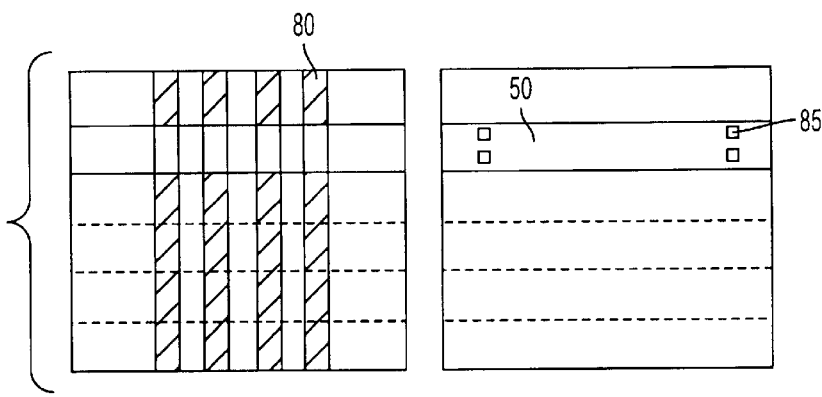
Figure 7I:
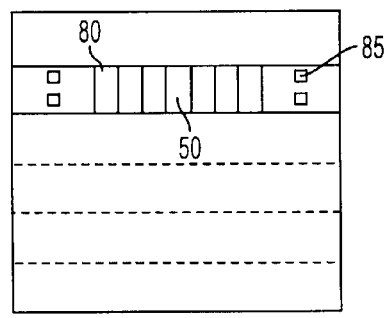
Figure 8:
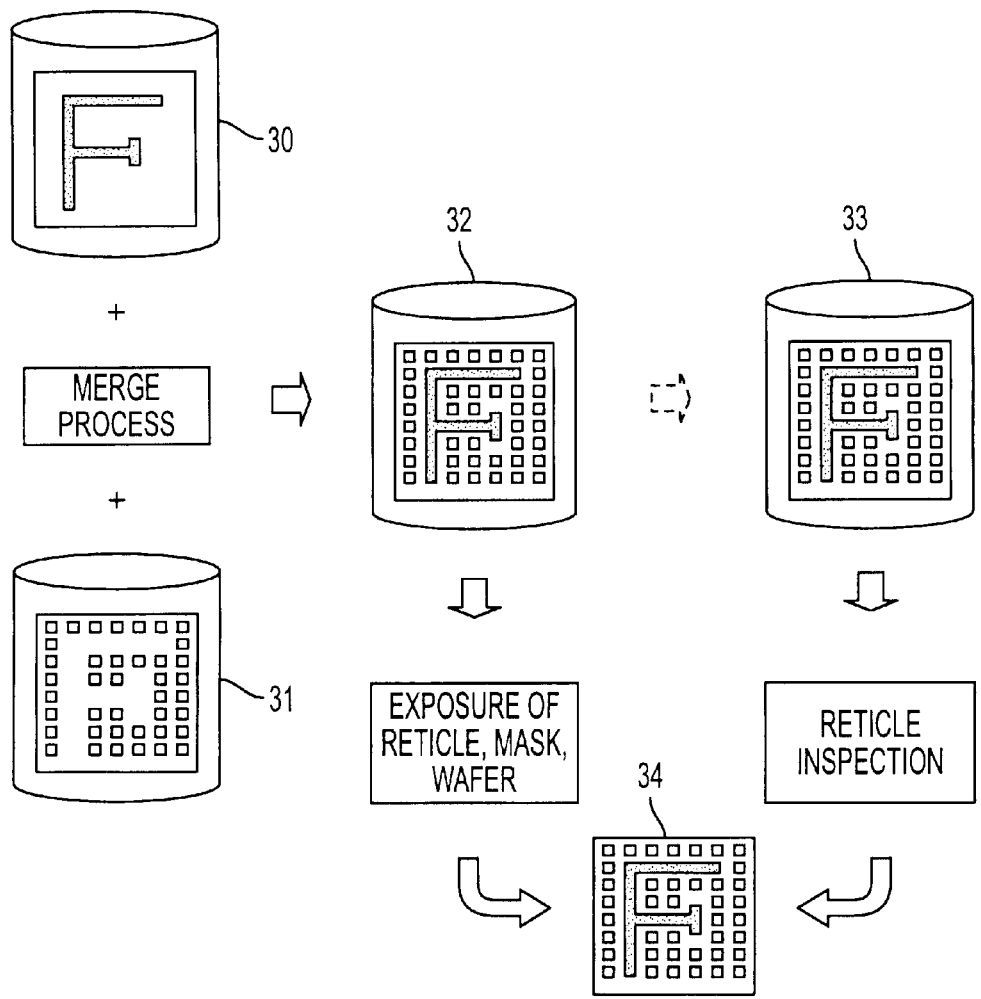
FIG. 8 is an illustration of the prior art.
Figure 9A:
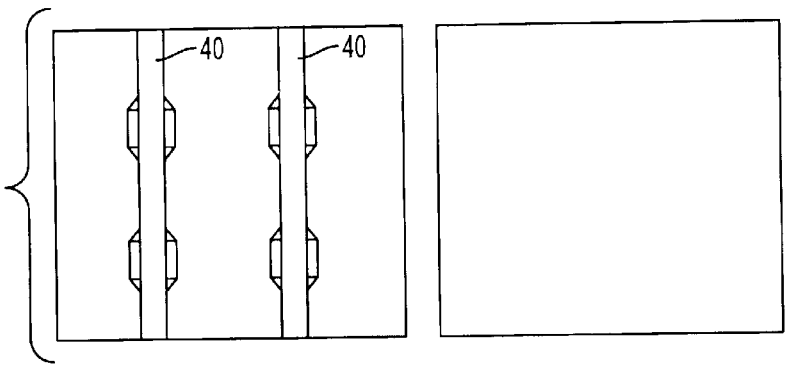
FIGS. 9(a) through 9(g) illustrate dummy pattern generation and merging according to the prior art.
Figure 9B:
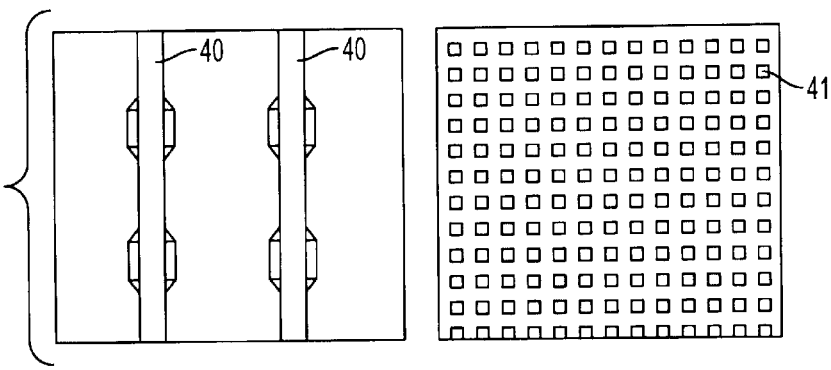
Figure 9C:
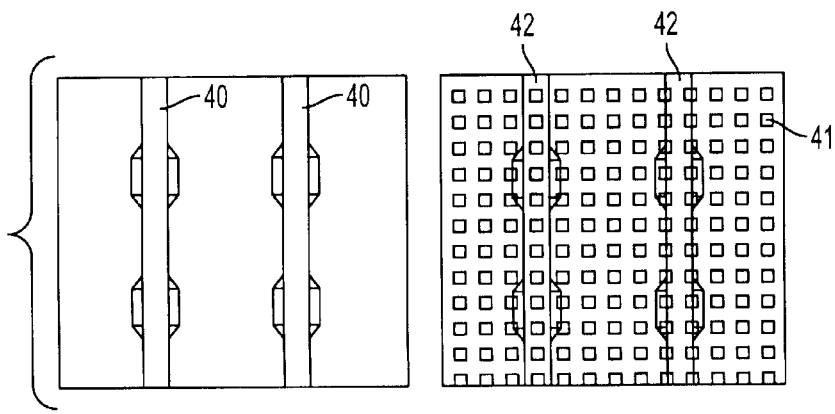
Figure 9D:
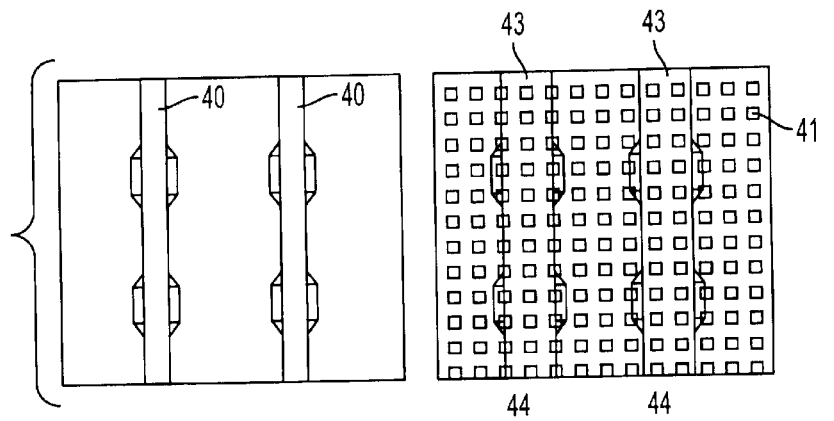
Figure 9E:
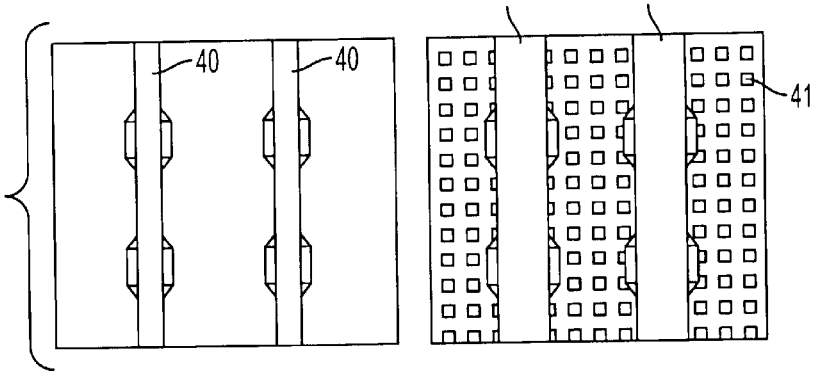
Figure 9F:
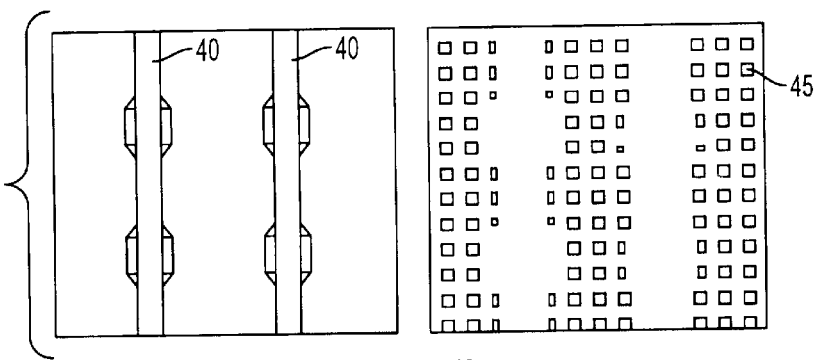
Figure 9G:
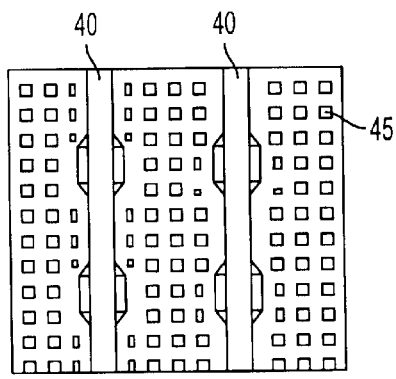

With reference to FIGS. 7(a) to 7(i), dummy pattern generating and merging according to the fourth embodiment of the present invention will now be explained. First, FIG. 7(a) illustrates the initial status. The exposing patterns 80 are wiring patterns having four vertical lines of equal width and arranged at equal intervals. The dummy patterns are not yet formed. Next, in FIG. 7(b), dummy patterns 81 having a designated shape are generated only in a designated area. The designated area of this embodiment is provided within the stripe area 50 which is equal to movement of one stage of the raster type apparatus. In this embodiment, like the second embodiment, processing of the upper second stripe area 50 will be explained. Next, in FIG. 7(c), exposing pattern 80 information corresponding to the area 50 of one stripe are read and then artificially overlapped on the dummy patterns 81 (hereinafter referred to as the artificially overlapped exposing patterns 82). In FIG. 7(d), the artificially overlapped exposing patterns 82 are shifted (they widen) toward their external sides a distance d1, the interval between the dummy patterns 81 and exposing patterns 80. In FIG. 7(e) some of the data is merged to remove the duplicated portions between the dummy patterns 81 and artificially overlapped exposing patterns 83 after the shift In FIG. 7(f), the artificially overlapped exposing patterns 84, after the shift, are further shifted toward their external sides by a distance d2, the interval required by the dummy patterns 81. This interval is equal to the range near the external side of a plurality of wiring patterns 80. This interval d2 is previously sent to the dummy pattern generation calculating unit 5 as rule data. In FIG. 7(g), some of the data is merged to remove the duplicated portions between the dummy patterns 85 and artificially overlapped exposing patterns 84, after the shift In FIG. 7(h), the artificially overlapped exposing patterns 84 after the shift are removed and the dummy patterns 80 are generated depending on the original exposing patterns 80 on the left-hand side of the figure are completed. Finally, in FIG. 7(*i*), the dummy patterns 85 generated in the preceding step are synthesized with the exposing patterns 80 and the generation and merge processes of the dummy patterns 85 for compensation corresponding to the exposing patterns 80 for the area 50 of one stripe are completed.

As explained above, it is also possible for the dummy patterns to be generated in an area identical to that in which the exposing patterns are extracted and only the dummy patterns conforming to a given rule can remain within this area.

Embodiments of the present invention, described above, provide that the high speed exposing pattern generating process and exposing process can be realized without an increase in the amount of data for exposing patterns and excessive load on a computer. Moreover, the time required for generating dummy patterns can be shortened.

Having thus described embodiments of the invention, various alterations, modifications and improvements will readily occur to those skilled in the art. Such alterations, modifications and improvements are intended to be within the scope and spirit of the present invention. Accordingly, the foregoing description is by way of example only and is not intended to be limiting. The invention's limit is defined only in the claims and the equivalents thereto.

What is claimed is:

1. A method of exposing a semiconductor integrated circuit comprising:

inputting exposing patterns into an exposing apparatus;

extracting exposing pattern data for a plurality of predetermined units of area from the exposing patterns;

generating dummy patterns;

merging the extracted exposing pattern data and corresponding dummy patterns for each unit of area; and exposing the merged exposing pattern data and dummy patterns for each predetermined unit of area.

2. The method according to claim 1, wherein said each of the predetermined units of area are equivalent to a unit of stage movement of the exposing apparatus.

3. The method according to claim 1, wherein the dummy pattern data for each of the predetermined units of area is generated within the respective predetermined unit of area under predetermined arranged conditions and is previously stored in the exposing apparatus.

4. The method according to claim 1, further comprising:

overlapping the exposing pattern data extracted from each predetermined unit of area and dummy patterns for each predetermined unit of area;

enlarging the overlapped exposing pattern data for a predetermined amount of area;

removing an overlapped portion from the overlapped exposing pattern data and dummy patterns;

generating second dummy patterns in which data from the overlapped portion is removed; and synthesizing the extracted exposing pattern data for each predetermined unit of area and the second dummy patterns.

5. An apparatus exposing a pattern of a semiconductor integrated circuit device, comprising:

a first memory storing exposing pattern data extracted for predetermined units of area;

a second memory storing corresponding dummy pattern data for the predetermined units of area; and a dummy pattern generation calculating unit synthesizing the dummy pattern data and the exposing pattern data.

6. A method of exposing a semiconductor integrated circuit comprising:

inputting an exposing pattern generated from a design pattern;

extracting pattern data for a plurality of area units from the input exposing pattern;

generating dummy pattern data;

merging the extracted pattern data with corresponding dummy pattern data for each area unit; and exposing the merged data for each area unit.

7. A method of exposing a pattern of a semiconductor integrated circuit device, comprising:

storing exposing pattern data extracted for predetermined area units;

storing corresponding dummy pattern data for the predetermined area units; and synthesizing the dummy pattern data and the exposing pattern data for the predetermined area units.

8. The method according to claim 7, wherein dummy pattern data is generated only in designated areas to compensate for a shape of the exposing pattern data.

* * * * *